United States Patent
Ishikawa et al.

(10) Patent No.: US 6,925,103 B2
(45) Date of Patent: Aug. 2, 2005

(54) GAIN-COUPLED DFB LASER DIODE

(75) Inventors: Tsutomu Ishikawa, Kawasaki (JP); Hirohiko Kobayashi, Kawasaki (JP); Norihiko Sekine, Kawasaki (JP); Hajime Shoij, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 10/282,230

(22) Filed: Oct. 29, 2002

(65) Prior Publication Data
US 2003/0086464 A1 May 8, 2003

(30) Foreign Application Priority Data
Nov. 2, 2001 (JP) ........................................ 2001-338407

(51) Int. Cl.[7] ............................................... H01S 5/187
(52) U.S. Cl. ........................................... 372/96; 372/46
(58) Field of Search ............................. 372/45, 46, 96, 372/43

(56) References Cited

U.S. PATENT DOCUMENTS 6,426,515 B2 * 7/2002 Ishikawa et al. ............... 438/22
6,452,318 B1   9/2002 Makimoto .................... 372/96
6,560,266 B2 * 5/2003 Shoji et al. ................... 372/96
6,574,256 B1 * 6/2003 Hofstetter et al. ............ 372/45
2003/0094617 A1 * 5/2003 Sekine ......................... 257/79

* cited by examiner

Primary Examiner—Minsun C. Harvey
Assistant Examiner—Cornelius H. Jackson
(74) Attorney, Agent, or Firm—Staas & Halsey LLP

(57) ABSTRACT

A gain-coupled DFB laser diode includes a multiple quantum well active layer and a pair of cladding layers sandwiching the multiple quantum well active layer vertically, wherein the multiple quantum well active layer includes a plurality of gain regions aligned in a direction of propagation of a laser beam and repeated periodically, each of the gain regions having a multiple quantum well structure, and a buried layer fills a gap between a pair of adjacent gain regions, wherein the buried layer includes a plurality of high-refractive index layers and a plurality of low-refractive index layers, each of the high-refractive index layers is formed of a first semiconductor material having a first bandgap, while each of the low-refractive index layers is formed of a second semiconductor material having a second, larger bandgap.

12 Claims, 8 Drawing Sheets

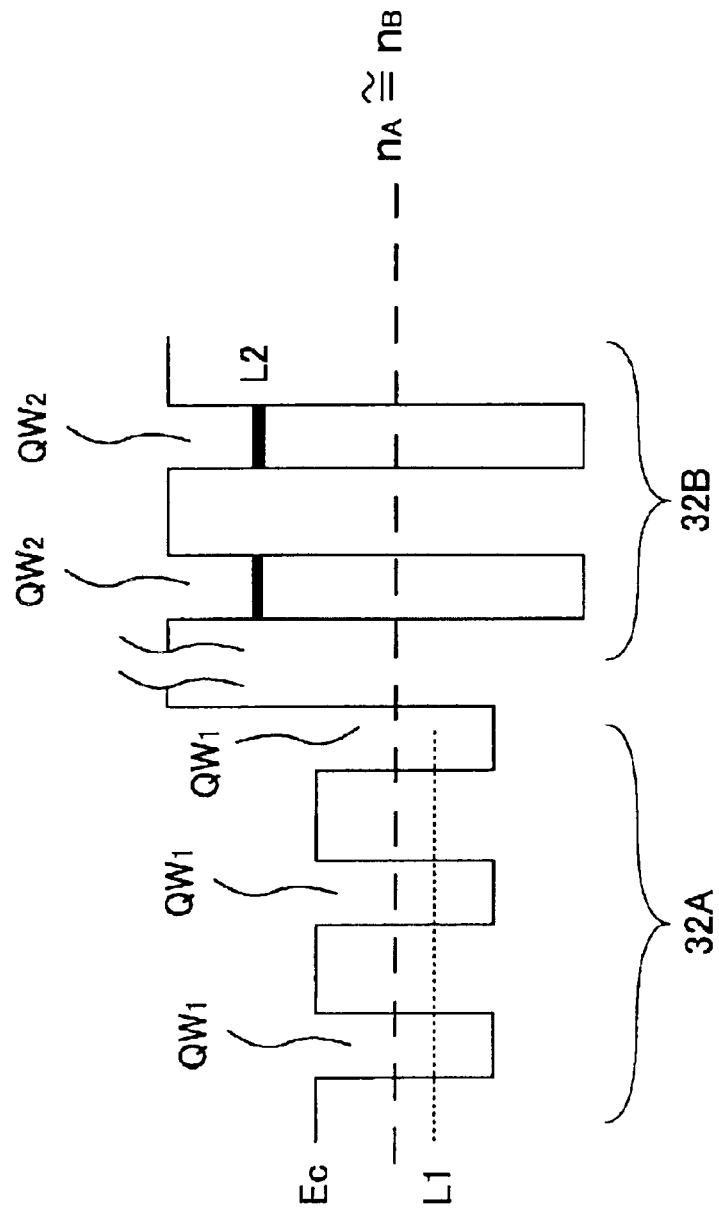

GAIN-COUPLED DFB LASER DIODE

CROSS-REFERENCE TO RELATED APPLICATION

The present application is based on Japanese priority application No. 2001-338407 filed on Nov. 2, 2001, the entire contents of which are hereby incorporated by reference.

BACKGROUND OF THE INVENTION

The present invention generally relates to semiconductor devices and more particularly to a semiconductor light-emitting device such as a laser diode.

A DFB laser diode has a diffraction grating formed along an active region thereof and achieves optical amplification or laser oscillation by distributed feedback action from the diffraction grating caused by Bragg diffraction. Such a DFB laser diode has an advantageous feature of stable device operation as compared with a laser diode of Fabri-Perot type, which has a pair of mirrors at axial ends. Thus, DFB laser diodes are used extensively in recent optical telecommunication systems.

In such a DFB laser diode having a diffraction grating, there is caused a refractive index modulation or periodical refractive index change in the diffraction grating, and the optical intensity becomes maximum at the axially central part of the laser diode due to the strong Bragg reflection from the diffraction grating. Because of this, there is a tendency that a non-uniform carrier distribution is induced inside the laser diode when the laser diode is driven to produce large output power. Associated with this non-uniform optical intensity distribution, the DFB laser diode tends to cause higher mode laser oscillation.

Meanwhile, there is a demand of providing a high-reflective film on a rear end of such a DFB laser diode for increasing the optical output power obtainable from the laser diode. However, existence of such a high-reflective film provided on a DFB laser diode deteriorates the stability of the laser oscillation significantly because the high-reflective film causes optical feedback action added to the nominal optical feedback action from the diffraction grating. Further, such a DFB laser diode suffers from the problem of unstable laser operation when a strong reflection beam comes in from an optical fiber. It should be noted that such a strong reflection beam provides additional and unwanted optical feedback action.

In view of these problems associated with a DFB laser diode having a Bragg diffraction grating and associated refractive index modulation, there is proposed a so-called gain-coupled DFB laser diode for realizing a single-wavelength laser diode having improved mode stability. A gain-coupled DFB laser diode is a DFB laser diode having a gain modulation structure, wherein the gain modulation structure forms a gain distribution such that the gain of the laser diode changes periodically in the direction of the optical cavity with a Bragg period.

Various structures are proposed so far for such a gain modulation structure, including a structure in which the thickness of the active layer or an optical guide layer is changed periodically, a structure in which current blocking patterns are formed periodically along an active layer, or a structure in which optical absorption patterns are provided adjacent to an active layer periodically.

Among others, the structure in which the number of quantum wells in an active layer of a multi-quantum structure is changed periodically has an advantageous feature in that the phase of gain coupling and the phase of refractive index coupling coincides with each other and that there occurs no extraneous optical absorption. Thus, the present invention focuses on a gain-coupled DFB laser diode in which the number of the quantum wells in the multiple quantum well structure is periodically changed.

FIGS. 1A and 1B are diagrams showing the construction of a conventional gain-coupled laser diode wherein FIG. 1B shows a part of FIG. 1A in an enlarged scale.

Referring to FIG. 1A, the gain-coupled laser diode is constructed on an n-type InP substrate 11 acting also as a cladding layer and includes an active layer 12 formed of multiple quantum well (MQW) structures A and B on the InP substrate 11 as represented in FIG. 1B. On the active layer 12, there is provided a cladding layer 13 of p-type InP, and a p-type electrode 14 is provided on the cladding layer 13. Further, an n-type electrode 15 is provided on the bottom surface of the substrate 11.

As represented in FIG. 1B in detail, the MQW structure B is formed so as to extend uniformly and continuously in the axial direction of the laser diode, while the MQW structures A are formed intermittently with a period set to be equal to the Bragg period, and as a result, the optical gain is modulated periodically in such an active layer 12 with the Bragg period. Here, it should be noted that the MQW structures A constitute a gain region 12A in which the gain modulation takes place. Further, it should be noted that there is formed a buried region 12B in a gap between a pair of adjacent gain regions 12A, and the gap thus formed is filled with an undoped InP layer having a large bandgap.

It should be noted that such a gain-coupled DFB laser diode 10 shows excellent mode stability over a conventional refractive-index-coupled DFB laser diode because of the gain coupling caused in the periodical gain regions 12A.

In the gain-coupled DFB laser diode 10 of FIGS. 1A and 1B, on the other hand, the buried region 12B of the InP buried layer has a generally smaller refractive index as compared with the gain region 12A, and because of this, there is also caused a refractive index modulation with the period of the diffraction grating, in addition to the gain modulation.

Thus, in the laser diode 10, there is caused not only the desired gain coupling but also a substantial amount of refractive index coupling similar to the case of conventional DFB laser diodes. Thus, when the laser diode is operated to provide large optical output power, there may be caused the problem of mode hopping in which the operational mode of the laser diode jumps to higher modes similarly to the case of conventional DFB laser diodes.

In such a gain-coupled DFB laser diode, therefore, the proportion of the gain-coupling coefficient over the refractive-index-coupling coefficient provides a profound effect on the mode stability and it is necessary to increase the proportion of the gain-coupling coefficient over the refractive-index-coupling coefficient as much as possible. In the case the contribution of the refractive-index-coupling could be minimized, the laser oscillation wavelength coincides the Bragg wavelength, which in turn is determined by the period of the gain regions. Thereby, significant mode stability would be achieved.

In view of such problems of conventional gain-coupled DFB laser diodes, the U.S. Pat. No. 5,452,318 proposes a gain-coupled laser diode 20 having a construction represented in FIG. 2.

Referring to FIG. 2, there is formed an optical confinement layer 22 of n-type GaInAsP on a substrate 21 of n-type InP via an intervening buffer layer 21A of n-type InP, and an active layer 23 is formed on the optical confinement layer 22 such that a gain region 23A of an MQW structure is repeated with a Bragg period in the active layer 23 in the axial direction of the laser diode. In each of the MQW structures constituting the gain region 23A, there is formed a quantum well layer having a bandgap Eg1 as the optical emission layer in which stimulated emission takes place.

In the structure of FIG. 2, there is formed an optical confinement layer 24 of p-type GaInAsP, and a buried layer 25 of p-type GaInAsP having a bandgap Eg3 larger than the bandgap Eg1 of the quantum well layer (Eg1<Eg3) is formed so as to fill the gap between a pair of adjacent gain regions 23A. In such a construction, in which the gain region 23A and also the buried region 23B filled with the buried layer 25 are formed of GaInAsP, it becomes possible to minimize the refractive index coupling.

In the structure of FIG. 2, on the other hand, it should be noted that a p-type GaInAsP layer 25A having a bandgap Eg2 larger than the bandgap Eg3 (Eg3<Eg2) is interposed between the optical confinement layer 22 and the buried region 23B, so as to concentrate the electric current to the gain region 23A and to block the current path of the electric current flowing directly to the optical confinement layer 22 from the buried region 23B.

The laser diode 20 of FIG. 2, while having an improved stability as compared with the laser diode 10 of FIGS. 1A and 1B, has a problem, particularly in the case of reducing the refractive index difference between the buried region 23B and the gain region 23A, in that the bandgap Eg3 of the buried region 23B has to be reduced to a value close to the bandgap Eg1 of the gain region 23A (Eg1≈Eg3). In such a case, however, the laser beam produced by the gain region 23A is absorbed by the buried region 23B and the efficiency of laser oscillation is deteriorated inevitably.

In order to avoid this problem of optical absorption, it is necessary to increase the bandgap Eg3 of the buried region 23B over the bandgap Eg1 of the gain region 23A, while such an increase of the bandgap Eg3 over the bandgap Eg1 causes the problem of increase of the refractive index difference between the gain region 23A and the buried region 23B, and hence the unwanted increase of the refractive-index-coupling coefficient.

Further, the laser diode 20 of FIG. 2, which uses a quaternary material of GaInAsP for the buried layer 25 for achieving lattice matching with respect to the InP substrate 21, suffers from the problem that the composition of the buried layer 25 tends to become non-homogeneous. Thus, there can be a problem of increase of defect density caused by lattice misfit in the region where the composition of the buried layer 25 is deviated from the lattice matching composition. It should be noted that such increase of the defect density can cause the problem such as degradation in the efficiency of optical emission or reduced lifetime of the laser diode.

SUMMARY OF THE INVENTION

Accordingly, it is a general object of the present invention to provide a novel and useful optical semiconductor device wherein the foregoing problems are eliminated.

Another and more specific object of the present invention is to provide an optical semiconductor device of gain-coupled type free from optical loss and minimum refractive-index-coupling.

Another object of the present invention is to provide a semiconductor light-emitting device, comprising:

a multiple quantum well active layer amplifying an optical beam in response to injection of an electric current;

a pair of cladding layers sandwiching said multiple quantum well active layer vertically from above and below for confining said optical beam in said multiple quantum well active layer; and an electrode for injecting said electric current into said multiple quantum well active layer, said multiple quantum well active layer including a plurality of gain regions aligned in a direction of propagation of said optical beam and repeated periodically, each of said gain regions having a multiple quantum well structure, a buried layer filling a gap between a pair of adjacent gain regions included in said plurality of gain regions, said buried layer comprising a plurality of high-refractive index layers and a plurality of low-refractive index layers, each of said high-refractive index layers comprising a first semiconductor material having a first bandgap, each of said plurality of low-refractive index layers comprising a second semiconductor material having a second, larger bandgap.

According to the present invention, the buried layer can be formed to have an overall refractive index generally equal to the refractive index of the gain region, by forming the buried layer filling the gap between adjacent gain regions from the high-refractive index layers and the low-refractive index layers. Thereby, it becomes possible to realize a gain-coupled DFB laser diode in which the refractive index coupling is suppressed effectively. By forming the high-refractive index layer from a semiconductor material having a bandgap energy smaller than a bandgap energy corresponding to the laser oscillation wavelength, it becomes possible to compensate for the low refractive index of the low-refractive index layers effectively. In the case of using a semiconductor material of small bandgap, there can be a problem of optical absorption of the laser beam by the high-refractive index layers. The present invention successfully avoids this problem of optical absorption by forming a quantum state in the high-refractive index layers at an energy level higher than the optical energy of the laser diode.

Thus, the gain-coupled DFB laser diode of the present invention can reduce the refractive-index-coupling coefficient to substantially zero, and very high mode stability is achieved. Because the buried layer thus formed includes a number of hetero barriers at the junction of the high-refractive index layer of small bandgap and the low-refractive index layer of large bandgap, injection of the electric current into such a buried layer is avoided, and there occurs efficient current injection into the gain regions. Thereby, the gain-coupling coefficient is increased further. Further, it becomes possible to use a binary compound such as InP for the material constituting the buried layer, and the problem associated with non-uniform composition of the buried layer is avoided.

Other objects and further features of the present invention will become apparent from the following detailed description when read in conjunction with the attached drawings.

BRIEF DESCRIPTION OF THE DRAWINGS

FIGS. 4A and 4B are diagrams showing the band structure of the DFB laser diode of FIGS. 3A and 3B;

DETAILED DESCRIPTION OF THE INVENTION

[First Embodiment]

Figure 1A:
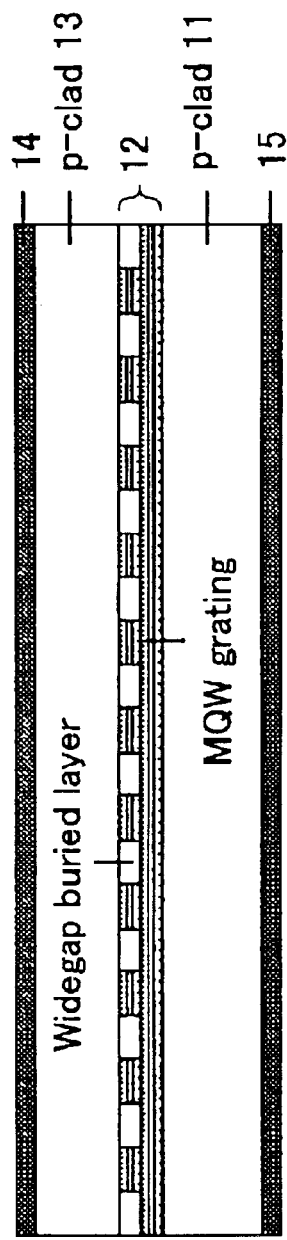
FIGS. 1A and 1B are diagrams showing the construction of a conventional DFB laser diode.
Figure 1B:
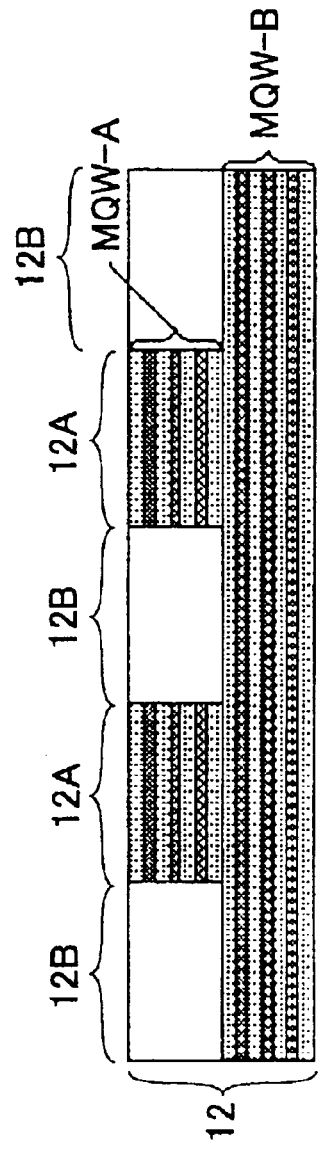
Figure 2:
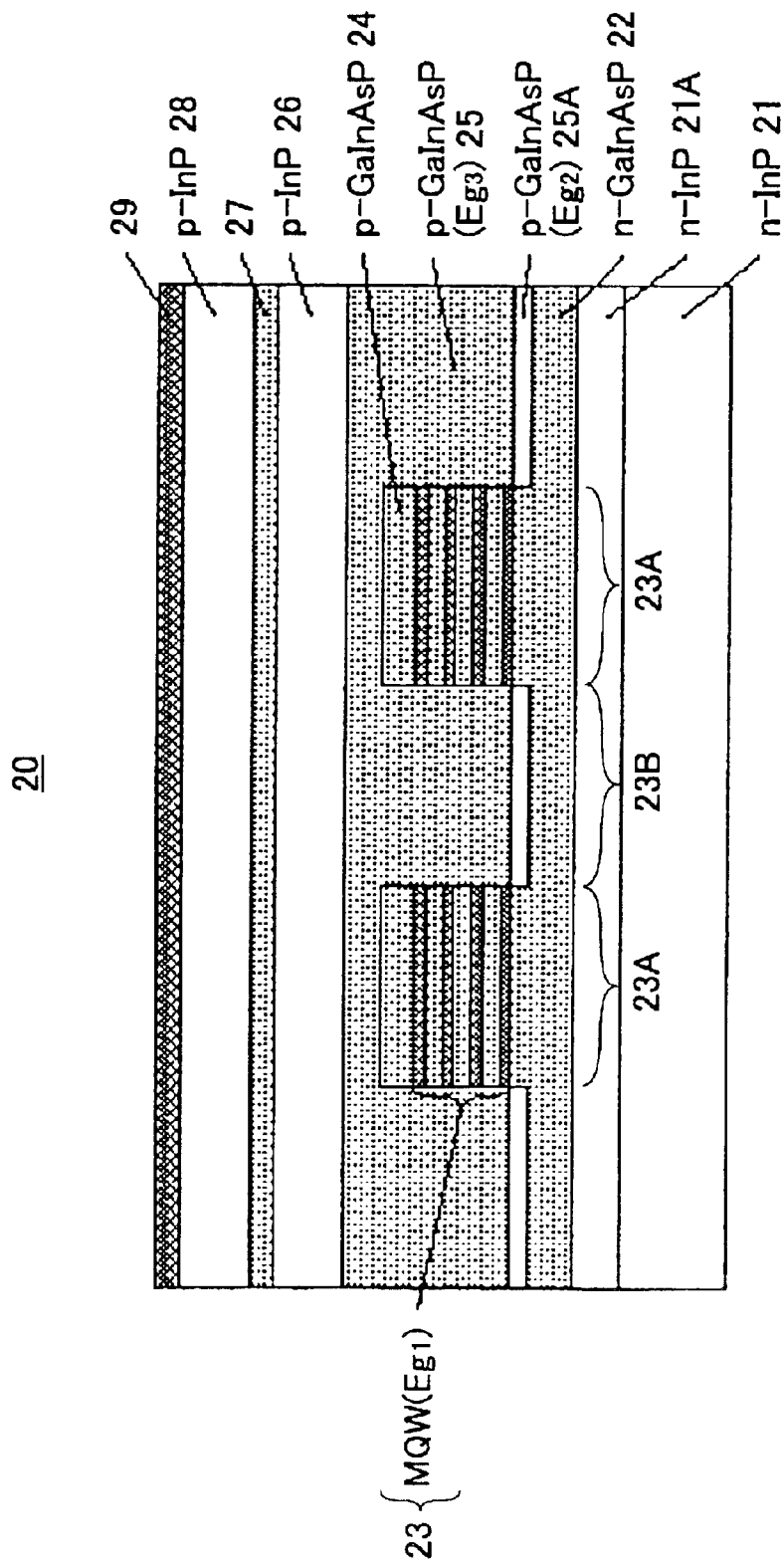
FIG. 2 is a diagram showing the construction of another conventional DFB laser diode.
Figure 3A:
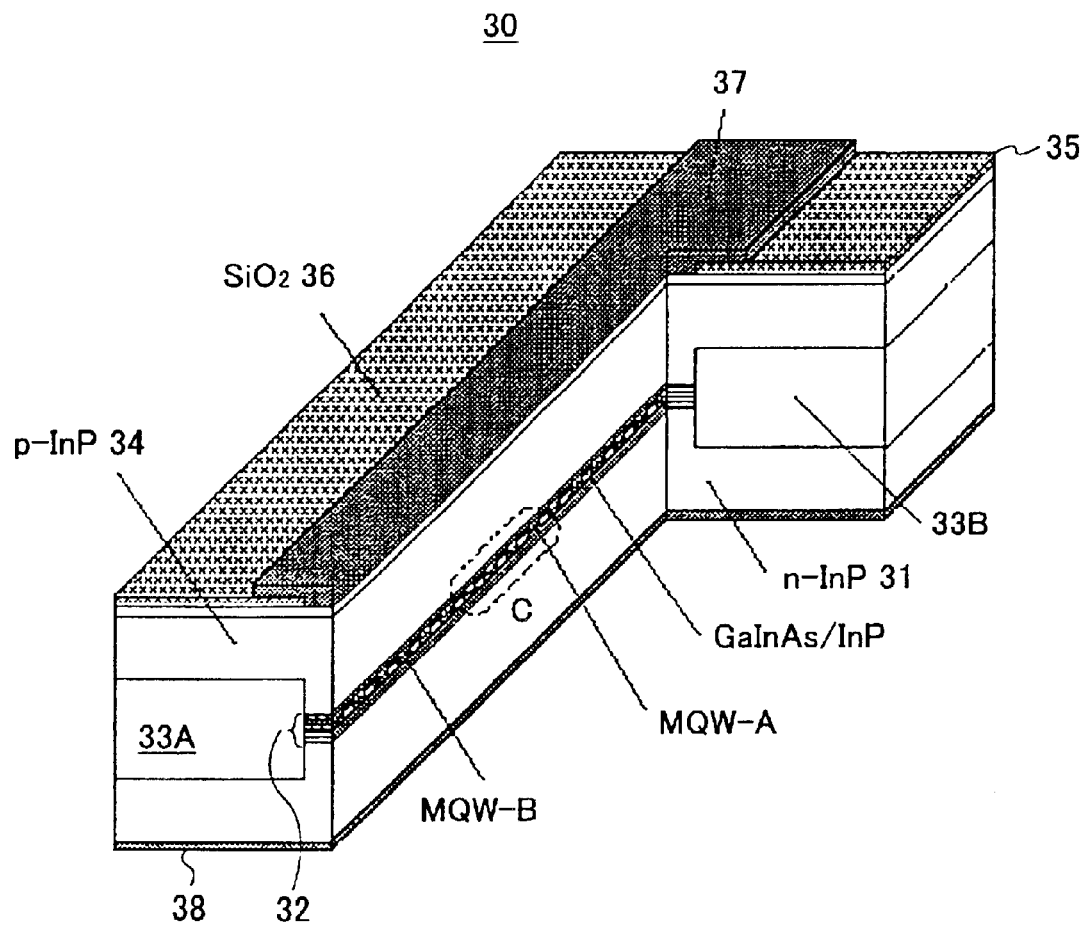
FIGS. 3A and 3B are diagrams showing the construction of a DFB laser diode according to a first embodiment of the present invention.
Figure 3B:
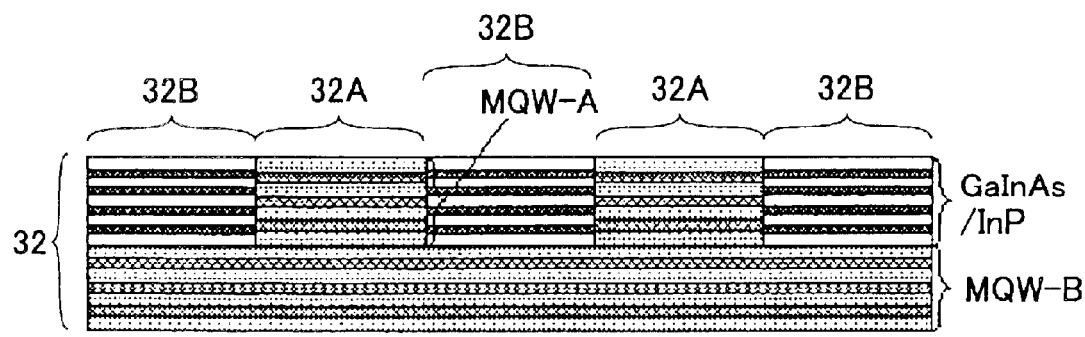

FIGS. 3A and 3B are diagrams showing the construction of a gain-coupled DFB laser diode 30 according to a first embodiment of the present invention, wherein FIG. 3B shows a region C of FIG. 3A in an enlarged scale.

Referring to FIG. 3A, the laser diode 30 is constructed on a substrate 31 of n-type InP acting also as a cladding layer and includes an active layer 32 formed of an MQW layer B extending continuously on the InP substrate 31 from a first end to a second end and a plurality of MQW layers A formed on the MQW layer B periodically with a Bragg diffraction period.

Each of the MQW layers A is formed of a GaInAsP quantum well layer having a composition represented as $Ga_{0.31}In_{0.69}As_{0.91}P_{0.09}$ corresponding to an optical-emission wavelength of 1.55 $\mu$m and a thickness of 5 nm and a GaInAsP barrier layer having a composition providing a bandgap wavelength of 1.2 $\mu$m and a thickness of 10 $\mu$m, wherein the quantum well layer and the barrier layer are laminated alternately for three periods. Further, the MQW layer B is formed also by laminating a similar GaInAsP quantum well layer and a similar GaInAsP barrier layer alternately for three periods. Thereby, the MQW layer A forms a gain region 32A.

Further, a buried region 32B is formed between a pair of adjacent gain regions 32A aligned in the axial direction of the laser diode, wherein the buried region 32B is filled with a buried layer as represented in FIG. 3B. It should be noted that the buried layer filling the buried region 32b in the present embodiment has a superlattice structure in which a GaInAs layer having a lattice matching composition of $Ga_{0.47}In_{0.53}As$ and a thickness of 6 nm and an InP layer having a thickness of 6.2 nm are laminated repeatedly for 4–5 times.

At both lateral sides of the active layer 32, there are formed current blocking regions 33A and 33B as represented in FIG. 3A, wherein each of the current blocking regions 33A and 33B has a layered structure in which a p-type InP layer and an n-type InP layer are laminated consecutively. On the current blocking regions 33A and 33B, there is formed a cladding layer 34 of p-type InP so as to cover the active layer 32.

On the InP cladding layer 34, there is formed a contact layer 35 of p-type GaInAsP and an $SiO_2$ protective film 36 is formed on the contact layer 35, wherein the $SiO_2$ protective film 36 is formed with an opening (not shown) extending in the axial direction of the laser diode, and a p-type ohmic electrode 37 is formed on the $SiO_2$ protective film 36 so as to make an ohmic contact with the contact layer 35 at the foregoing opening. Further, an n-type ohmic electrode 38 is provided on the bottom surface of the InP substrate 31.

FIGS. 4A and 4B are band diagrams showing a conduction band Ec of the gain region 32A and a conduction band Ec of the buried region 32B of the active layer 32 of FIG. 3B respectively.

Referring to FIG. 4A, there is formed a quantum level L1 in the quantum well layer QW1 in the gain region 32A, and optical emission is caused as a result of transition of carriers between the quantum level L1 and a corresponding quantum level formed in a valence band.

In the buried region 32B shown in FIG. 4B, on the other hand, it can be seen that the InP barrier layer provides a barrier height much higher than the barrier height provided by the GaInAsP barrier layer in the gain region 32A. Further, it will be noted in FIG. 4B that there is formed a quantum well layer QW2 having a bandgap much smaller than the bandgap of the GaInAsP quantum well layer QW1 of the gain region 32A in the buried region 32B. Such a quantum well layer QW2 having a small bandgap generally provides a large refractive index, and because of this, the buried region 32B as a whole can provide a refractive index $n_B$ adjusted to be generally equal to the refractive index $n_A$ of the gain region 32A as a result of superposition of the high refractive index of the quantum well layer QW2 and the low refractive index of the wide-gap InP barrier layer.

In order to avoid optical absorption caused by the quantum well layer QW2 of the buried region 32B, it is preferable to form the quantum well layer QW2 to have a width such that a fundamental quantum level L2 therein is located at the higher energy side of the quantum level L1.

In the present embodiment, the buried region 32B includes lamination of the InP layer, which is a binary material, and the GaInAs layer, which is a ternary mixed crystal. In the present embodiment, because of the very small thickness of the GaInAs layer, it is possible to suppress the formation of compositional deviation in the mixed crystal composition at the time of growth of the buried region 32B, and the buried region 32B can be formed with a uniform composition.

FIGS. 5A–5I show the fabrication process of the laser diode 30 of FIGS. 3A and 3B.

Figure 5A:
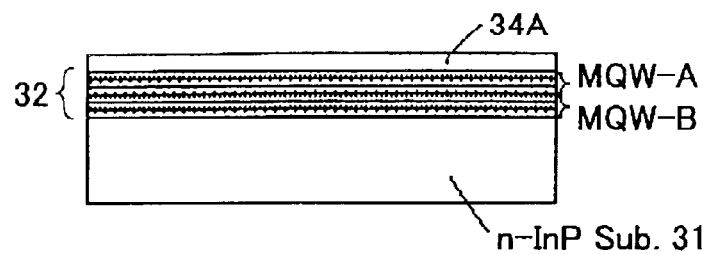
FIGS. 5A–5I are diagrams showing the fabrication process of the DFB laser diode of FIGS. 3A and 3B.

Referring to FIG. 5A, there is formed an active layer 32 on the InP substrate 31 by forming the MQW layers B and A, and the active layer 32 thus formed is covered by the cladding layer 34A of p-type InP.

Figure 5B:
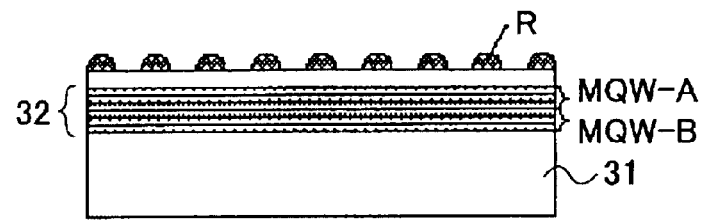
Figure 5C:
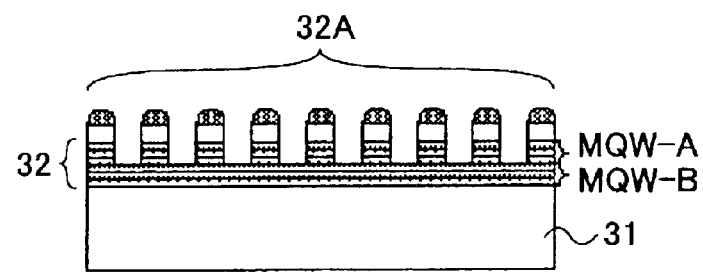

Next, in the step of FIG. 5B, a resist pattern R is formed on the InP cladding layer 34A by an interference exposure process or an electron beam exposure process with a Bragg diffraction period, and the InP cladding layer 34A and the underlying MQW layer A are patterned in the step of FIG. 5C while using the resist pattern R as a mask. As a result, the gain regions 32A are formed.

Figure 5D:
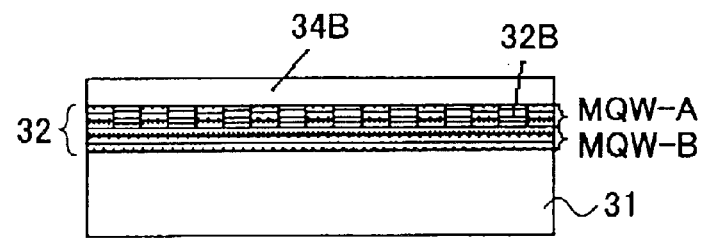

Next, in the step of FIG. 5D, the buried region 32B between a pair of adjacent gain regions 32A is filled with the buried layer having a superlattice structure in which the GaInAs quantum well layer and the InP barrier layer are laminated alternately. Further, the cladding layer 34B of p-type InP is formed on the buried region 32B.

Figure 5E:
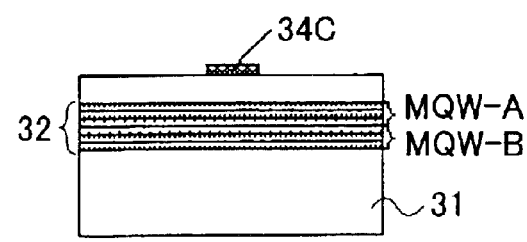
Figure 5F:
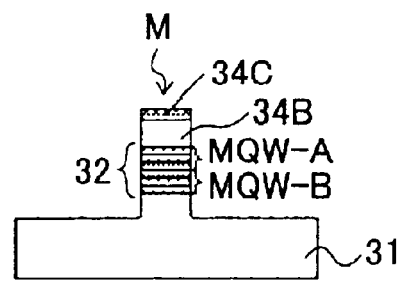
Figure 5G:
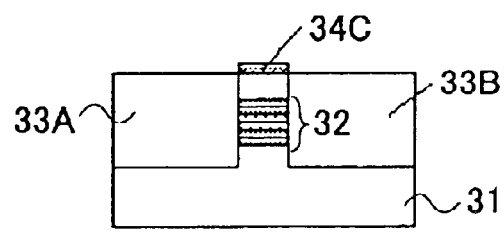

Next, in the step of FIG. 5E, an $SiO_2$ pattern 34C is formed on the cladding layer 34B so as to extend in the axial direction of the laser diode, and the cladding layer 34B, the MQW layer A and the MQW layer B are subjected to an etching process in the step of FIG. 5F while using the $SiO_2$ pattern 34C as a mask. As a result, there is formed a mesa structure M extending in the axial direction of the laser diode.

Next, in the step of FIG. 6G, a regrowth process is conducted while using the SiO2 pattern 34C as a mask, and a p-type InP layer and an n-type InP layer are grown consecutively so as to fill both lateral sides of the mesa structure M. With this, the current blocking regions 33A and 33B are formed.

Figure 5H:
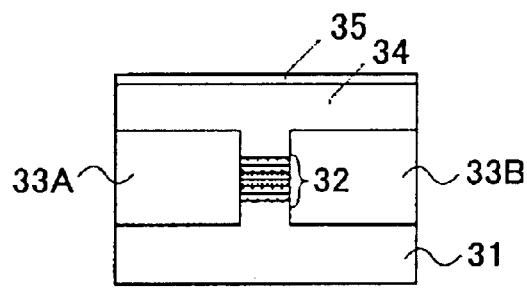

Next, in the step of FIG. 5H, the $SiO_2$ pattern 34C is removed, and the cladding layer 34 of p-type InP is formed in continuation with the InP cladding layer 34B such that the InP cladding layer covers the current blocking regions 33A and 33B. Further, the contact layer 35 of p-type GaInAsP is formed on the InP cladding layer 34.

Figure 5I:
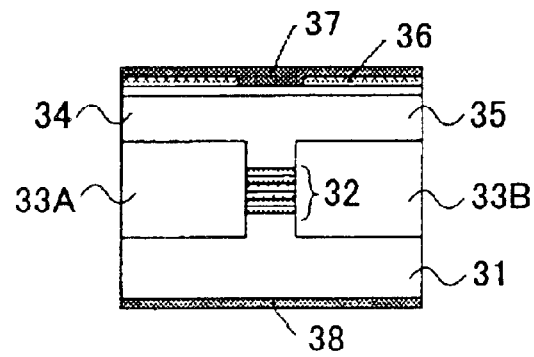

Next, in the step of FIG. 5I, the $SiO_2$ protective film 36 is formed on the contact layer 35 and the opening exposing the contact layer 35 is formed in the protective film 36 along the mesa structure. Further, the p-type electrode 36 is formed on the protective film 36 in contact with the contact layer 35 at the foregoing opening, and the n-type electrode 38 is formed on the bottom surface of the InP substrate 31

As explained before, it becomes possible to suppress the variation of refractive index in the active layer 32 in the gain-coupled DFB laser diode 30 of such a construction, and the laser diode provides a stable single-mode operation, even in such a case in which an anti-reflection coating is provided on the exit end of the laser diode and a reflective film is provided at an opposite end of the laser diode.

In an example of fabricating a laser diode having a cavity length of 600 $\mu$m, it became possible to realize a side-mode suppression ration exceeding 50 dB in the DFB laser diode 30 of the present embodiment at the time the laser diode is driven to provide an output optical power of 2 mW. Further, it was confirmed that the DFB laser diode 30 performs stable single mode operation up to the output optical power of 40 mW.

Further, it was confirmed that the DFB laser diode of the present embodiment achieves the threshold current of 1 mA and a slope efficiency of 0.3 W/A. In addition, it was confirmed, as a result of a durability test at the optical power of 30 mW, that the increase of the drive current after 5000 hours is 5% or less. In addition, it was confirmed that there occurs no increase of crystal defect density in the DFB laser diode of the present embodiment in spite of the construction in which the gain region 32A and the buried region 32B are formed alternately.

In the present embodiment, the buried regions 32B may be filled with the materials such as GaInAsP, GaInAs, AlGaInAs, AlInAs, InP or a mixed crystal thereof.

[Second Embodiment]

Figure 6:
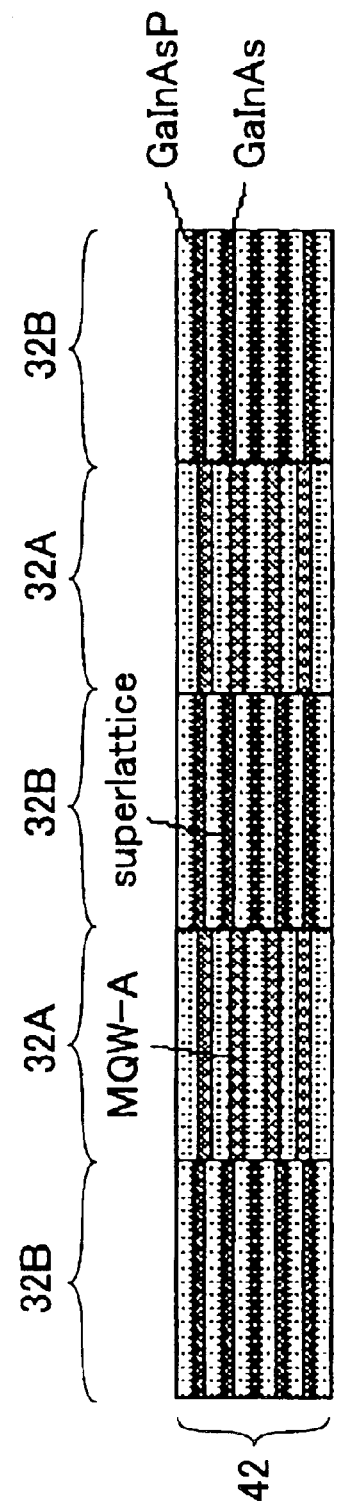
FIG. 6 is a diagram showing the construction of an active layer of a DFB laser diode according to a second embodiment of the present invention.

FIG. 6 shows the construction of an active layer 42 of a gain-coupled DFB laser diode according to a second embodiment of the present invention. It should be noted that the laser diode of the present embodiment has a construction similar to that of FIGS. 3A and 3B except that the active layer 32 is replaced with the active layer 42 of FIG. 6. In the drawing, those parts corresponding to the parts explained previously are designated by the same reference numerals and the description thereof will be omitted.

Figure 7:
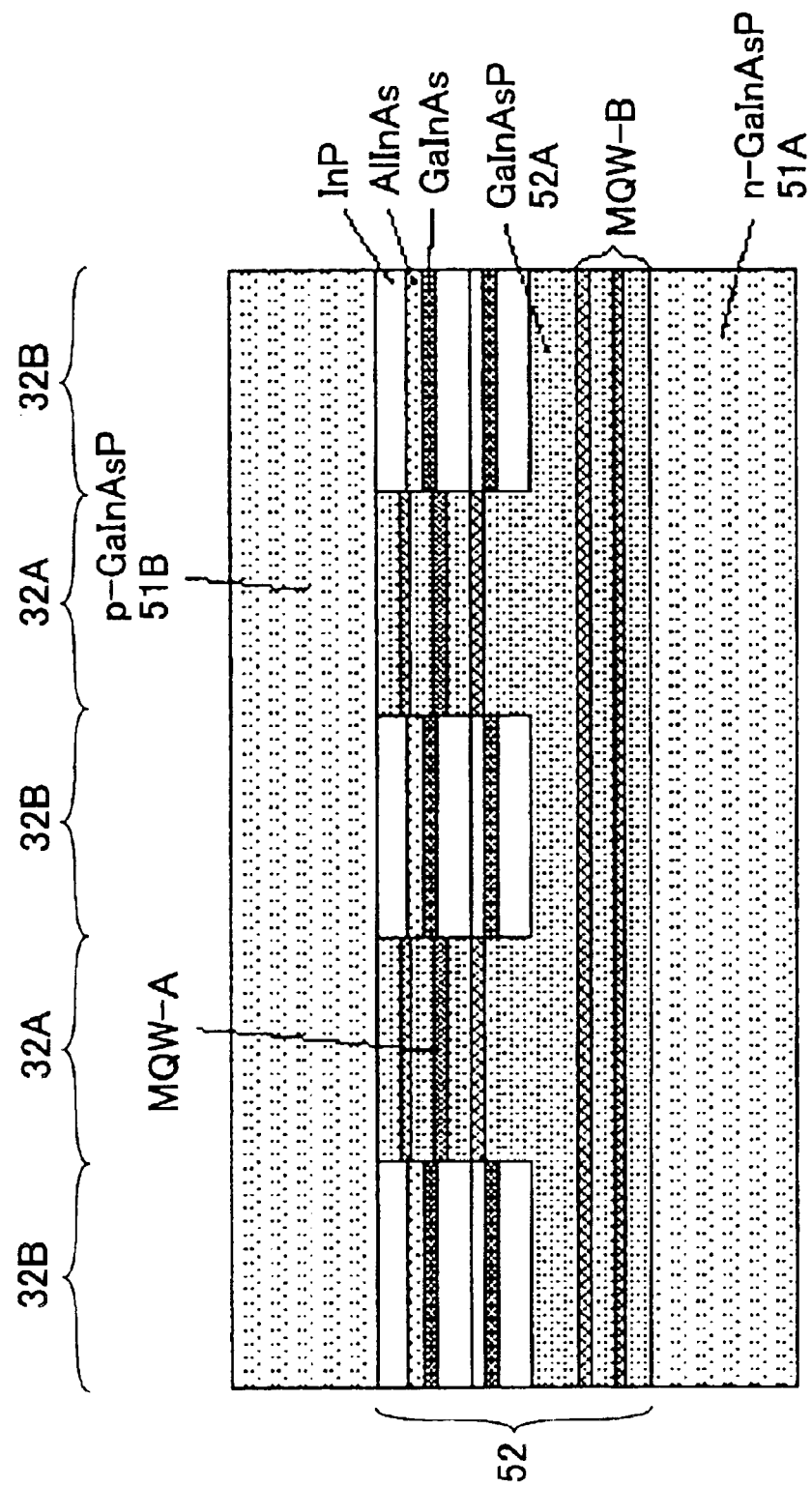
FIG. 7 is a diagram showing an active layer and a surrounding region of a DFB laser diode according to a third embodiment of the present invention.

Referring to FIG. 7, the MQW layer B is removed in the present embodiment, and thus, the buried region 32B extends form the top surface to the bottom surface of the active layer 42.

Thus, in the present embodiment, the buried region 32B is filled with the buried layer of the superlattice structure in which a GaInAs layer having a thickness of 4.6 nm and a GaInAsP layer having a thickness of 7.8 nm both having a lattice matching composition to the InP substrate are laminated alternately. In the case the bandgap wavelength of the GaInAsP layer is 1.2 $\mu$m, in particular, a refractive index identical with the refractive index of the gain region 32A is realized for the buried region 32B. As a result, the refractive index coupling coefficient becomes substantially zero in the DFB laser diode having the active layer 42 of FIG. 6.

It was confirmed that the DFB laser diode of the present invention provides an oscillation spectrum in which the oscillation wavelength is located generally at the center of the stop band in the state that an antireflection film is provided at both ends of the laser diode. Thus, excellent mode stability is realized in the DFB laser diode of the present embodiment.

[Third Embodiment]

FIG. 7 shows the construction of a DFB laser diode according to a third embodiment of the present invention wherein FIG. 7 shows an active layer 52 and a surrounding region of the laser diode. It should be noted that the laser diode of the present embodiment has a construction similar to that of FIGS. 3A and 3B except that the active layer 32 is replaced with the active layer 52 of FIG. 7. In the drawing, those parts corresponding to the parts explained previously are designated by the same reference numerals and the description thereof will be omitted.

Referring to FIG. 7, the present embodiment has a construction in which the active layer 52 is sandwiched by a pair of optical confinement layers 51A and 51B respectively of n-type GaInAsP and p-type GaInAsP, wherein each of the optical confinement layers 51A and 51B has a bandgap wavelength of 1.1 $\mu$m and a thickness of 50 nm.

In the present embodiment, the active layer 52 includes the MQW layer B extending over the entire length of the active layer 52 and the MQW layers A formed on the MQW layer B provide the plural gain regions 32A similarly as before, wherein the buried region 32B between a pair of adjacent gain regions 32A is filled with a buried layer having a superlattice structure in which an InP layer having a thickness of 13 nm, a GaInAs layer having a thickness of 6.5 nm and a lattice matching composition to the InP substrate, and an AlInAs layer having a thickness of 6.5 nm and a lattice matching composition to the InP substrate are repeated twice. Further, an InP layer having a thickness of 6.5 nm is formed on the uppermost AlInAs layer as the top part of the superlattice structure forming the buried layer.

In the DFB laser diode of the present embodiment, it is further noted that a GaInAsP intermediate layer 52A having a bandgap wavelength of 1.2 $\mu$m is interposed between the MQW layer A and the MQW layer B so as to secure sufficient tolerance at the time of forming the diffraction grating structure of the gain regions 32B by way of an etching process. This GaInAsP intermediate layer 52A may be formed with a thickness such as 40 nm before the formation of the diffraction grating, and the etching process is controlled with regard to the etching rate or etching duration such that the etching process stops at the location offset from the surface of the intermediate layer 52A with a distance of 20 nm. With such a construction, the existence of the intermediate layer 52A effectively eliminates the possibility that the MQW layer B is etched even in the case there exists variation in the etching process.

It was confirmed in the present embodiment that a threshold current is reduced to 3 mA and a slope efficiency of 0.40 W/A is realized by the DFB laser diode of the present embodiment in the case the DFB laser diode is formed with a cavity length of 300 $\mu$m and an anti-reflection coating and a high-reflective film are provided respectively at the front end and the rear end of the laser diode.

Further, the present invention is not limited to the embodiments described heretofore, but various variations and modifications may be made without departing from the scope of the invention.

What is claimed is:

1. A semiconductor light-emitting device, comprising:
   a multiple quantum well active layer amplifying an optical beam in response to injection of an electric current;

a pair of cladding layers sandwiching said multiple quantum well active layer vertically from above and below for confining said optical beam in said multiple quantum well active layer; and an electrode for injecting said electric current into said multiple quantum well active layer, said multiple quantum well active layer including a plurality of gain regions aligned in a direction of propagation of said optical beam and repeated periodically, each of said gain regions having a multiple quantum well structure, a plurality of buried layers, each filling a gap between a pair of adjacent gain regions of said plurality of gain regions, each of said buried layers comprising a plurality of high-refractive index layers end a plurality of low-refractive index layers, each of said high-refractive index layers comprising a first semiconductor material having a first bandgap and each of said plurality of low-refractive index layers comprising a second semiconductor material having a second, larger bandgap.

2. The semiconductor light-emitting device as claimed in claim 1, wherein said high-refractive index layer and said tow-refractive index layer are formed alternately in said buried layer.

3. The semiconductor light-emitting device as claimed in claim 1, wherein said buried layer is transparent to a laser beam produced in said gain region.

4. The semiconductor light-emitting device as claimed in claim 1, wherein each of said plurality of high-refractive index layers constituting said buried layer is formed of a quantum wall having a quantum level higher than a quantum level of a quantum well structure forming said multiple quantum well active layer.

5. The semiconductor light-emitting device as claimed in claim 1, wherein each of said plurality of high-refractive index layers constituting said buried layer has a bandgap smaller than a bandgap of a quantum well layer constituting said multiple quantum well active layer, each of said plurality of low-refractive index layers constituting said buried layer has a bandgap larger than a bandgap of a barrier layer constituting said quantum well active layer and located adjacent to said quantum well layer.

6. The semiconductor light-emitting device as claimed in claim 1, wherein each of said low-refractive index layers constituting said buried layer is formed of a binary compound.

7. The semiconductor light-emitting device as claimed in claim 1, wherein said buried layer is formed of a material selected from the group consisting of GaInAsP, GaInAs, AlGaInAs, AlInAs, InP and a mixed crystal system thereof.

8. The semiconductor light-emitting device as claimed in claim 1, wherein each of said high-refractive index layers constituting said buried layer is formed of a GaInAs layer having a lattice matching composition to an InP substrate, and wherein each of said low-refractive index layers constituting said buried layer is formed of an InP layer.

9. The semiconductor light-emitting device as claimed in claim 1, wherein each of said high-refractive index layers constituting said buried layer is formed of a GaInAs layer having a lattice matching composition to an InP substrate, and each of said low-refractive index layers constituting said buried layer is formed of a GaInAsP layer having a lattice matching composition to said InP substrate.

10. The semiconductor light-emitting device as claimed in claim 1, wherein said gain region has a refractive index generally equal to a refractive index of said buried layer.

11. The semiconductor light-emitting device as claimed in claim 1, wherein said multiple quantum well active layer including a continuous part having a multiple quantum well structure and extending from a first end to a second end thereof, said plurality of gain regions being formed on said continuous part.

12. The semiconductor light-emitting device as claimed in claim 1, wherein said buried layer includes a third semiconductor layer between said high-refractive index layer and said low-refractive index layer, said intermediate layer having an intermediate refractive index.

* * * * *

UNITED STATES PATENT AND TRADEMARK OFFICE
CERTIFICATE OF CORRECTION

PATENT NO. : 6,925,103 B2  Page 1 of 1
DATED : August 2, 2005
INVENTOR(S) : Tsutomu Ishikawa et al.

It is certified that error appears in the above-identified patent and that said Letters Patent is hereby corrected as shown below:

Title page,
Item [56], References Cited, U.S. PATENT DOCUMENTS,
change "6,452,318 B1" to -- 5,452,318 B1 --.

Column 9,
Line 17, change "end" to -- and --.
Line 25, change "tow-refractive" to -- low-refractive --.
Line 33, change "wall" to -- well --.

Column 10,
Line 11, change "GalnAsP" to -- GaInAsP -- and change "GalnAs" to -- GaInAs --.
Line 31, change "including" to -- includes --.

Signed and Sealed this

Eighteenth Day of April, 2006

JON W. DUDAS
*Director of the United States Patent and Trademark Office*

UNITED STATES PATENT AND TRADEMARK OFFICE
CERTIFICATE OF CORRECTION

PATENT NO. : 6,925,103 B2  Page 1 of 1
APPLICATION NO. : 10/282230
DATED : August 2, 2005
INVENTOR(S) : Tsutomu Ishikawa et al.

It is certified that error appears in the above-identified patent and that said Letters Patent is hereby corrected as shown below:

On the cover page:

(75) Inventors, change "Shoij" to --Shoji--

Signed and Sealed this

Fifteenth Day of July, 2008

JON W. DUDAS
*Director of the United States Patent and Trademark Office*